United States Patent [19]

Nelson et al.

[11] Patent Number: 4,864,581
[45] Date of Patent: Sep. 5, 1989

[54] SEMICONDUCTOR STRUCTURES AND A METHOD OF MANUFACTURING SEMICONDUCTOR STRUCTURES

[75] Inventors: Andrew W. Nelson, Felixstone, England; Richard E. Hobbs, Bredfield; W. John Devlin, Ipswich; Charles G. Lenton, Eye, all of England

[73] Assignee: British Telecommunications public limited company, United Kingdom

[21] Appl. No.: 19,591
[22] PCT Filed: Jul. 3, 1986
[86] PCT No.: PCT/GB86/00387
  § 371 Date: Mar. 2, 1987
  § 102(e) Date: Mar. 2, 1987
[87] PCT Pub. No.: WO87/00348
  PCT Pub. Date: Jan. 15, 1987

[30] Foreign Application Priority Data

Jul. 3, 1985 [GB] United Kingdom ................ 8516853

[51] Int. Cl.$^4$ .............................................. H01S 3/19
[52] U.S. Cl. ....................................... 372/46; 437/129
[58] Field of Search .................... 437/89, 90, 81, 126, 437/129, 133; 148/DIG. 10; 372/44, 46; 357/17, 56

[56] References Cited

U.S. PATENT DOCUMENTS 4,425,650 1/1984 Mito et al. ............................ 372/46
4,468,850 8/1984 Zong-Long Liau et al. .... 29/569 L

FOREIGN PATENT DOCUMENTS 0038085 10/1981 European Pat. Off.
0114109 7/1984 European Pat. Off.

OTHER PUBLICATIONS

Electronics Letters, 15 Sep. 1983, vol. 19, No. 19, "GaAlAs Buried-Heterostructure Lasers Grown by a Two-Step MOCVD Process"-pp. 759-760.
Electronics Letters, 21st Jan. 1982, Vol. 18, No. 2; "MBE Growth InGaAs/InP Bh Lasers with LPE burying Layers"-pp. 91092.
IEEE Journal of Quantum Electronics, vol. QE15, No. 8, Aug. 1979; "Growth and Characterization of MO/VPE Double-Heterojunction Lasers"-pp. 762-765.
Electronics Letters, 11th Oct. 1984, vol. 20, No. 21-"Low Threshold and Low Dispersion MOCVD/LPE Buried-Heterostructure GaAs/GaAlAs Lasers"-pp. 857-859.
Electronic Letters, 20(1984), Oct., No. 21, "CW Operation of GaInAsP Buried Ridge Structure Laser at 1.5 $\mu$m Grown by LP-MOCVD"-pp. 850-851.
IEEE Electron Device Letters-EDL-4 (1984), Aug., No. 8, New York, USA; "GaAs/GaAlAs Selective MOCVD Epitaxy and Planar Ion-Implanation Technique for Complex Integrated Optoelectronic Circuit Applications"-pp. 306-309.

Primary Examiner—James W. Davie
Attorney, Agent, or Firm—Nixon & Vanderhye

[57] ABSTRACT

A semiconductor structure and methods for making it, for use in opto-electronic devices, employs only MOVPE growth steps. The structure is based on a mesa having substantially non-reentrant sides. An initial semiconductor structure is produced which includes a substrate with a mesa having a self-aligned, central stripe of metal organic vapor phase growth suppressing material on its uppermost surface. Burying layers are then grown by MOVPE at either side of the mesa, the stripe removed, and covering layers grown over the mesa and adjoining regions of the burying layers. To make an opto-electronic device, a silica window can be formed on the uppermost surface of the covering layers and contacts provided through the window and to the remote face of the substrate. Two methods of making the initial semiconductor structure are described. Devices such as optical detectors and waveguides can be made using methods according to the invention. Particularly importantly, semiconductor lasers which will operate in a single transverse mode can be made.

14 Claims, 5 Drawing Sheets

SEMICONDUCTOR STRUCTURES AND A METHOD OF MANUFACTURING SEMICONDUCTOR STRUCTURES

FIELD OF THE INVENTION

The present invention relates to semiconductor structures and methods of making them. It finds particular application in the field of opto-electronic devices such as semiconductor lasers, and their manufacture.

BACKGROUND OF THE INVENTION

A known family of opto-electronic devices has the following central structure: a substrate of semiconductor material having a mesa thereon, with burying layers on either side of the mesa. Such a device is described by O. Mikami et al in "1.5 $\mu$m GaInAsP/InP Buried Heterostructure Lasers Fabricated by Hybrid Combination of Liquid— and Vapour-Phase Epitaxy", Electronics Letters, 18 (5) (4.3.82) pages 237-239. The word "mesa" in this context is used to describe an upstanding stripe having steep sides and a flat top.

The devices of the family include a p-n junction across which current flows (the conventional current from p to n) and a waveguide region to which light is confined. The waveguide region may comprise an "active layer" in which electrons and holes combine with the production of photons by radiative recombination. Such an active layer has to relate suitably in band gap and refractive index to the other semiconductor regions of the structure in order to achieve a suitable degree of "confinement" of these processes to the active layer. The layers of material to either side of the waveguide region and in contact with the opposite faces of the waveguide region are known as "confinement layers".

A major field of application of semiconductor optical devices is in optical fibre communications systems. In general, the devices are constructed out of materials whose elemental components are selected from Groups III and V of the Periodic Table. Silica optical fibres as produced in recent years have loss minima at 1.3 $\mu$m and 1.55 $\mu$m approximately, the latter minimum being the lower. Accordingly, there is an especial need for devices operating in the range from 1.1 to 1.65 $\mu$m, especially from 1.3 to 1.6 $\mu$m. (These wavelengths, like all the wavelengths herein except where the context indicates otherwise, are in vacuo wavelengths). Semiconductor lasers operating in this region of the infrared usually comprise regions of indium phosphide, InP, and of quaternary materials indium gallium arsenide phosphides, $In_xGa_{1-x}As_yP_{1-y}$. By suitable choices of x and y it is possible to lattice-match the various regions while varying the band gaps of the materials. (Band gaps can be determined experimentally by, for example, photoluminescence). Additionally, both indium phosphide and the quaternary materials can be doped to be p— or n-type as desired.

Describing a selected device of the known family, a semiconductor laser, with its mesa uppermost, it has an active layer within the mesa. Electrical contacts are provided to the mesa and on the furthermost face of the substrate from the mesa. The "confinement" required is provided optically in a vertical direction, by changes in refractive index of the semiconductor material, and both optically and electrically in a horizontal direction by the burying layers. The burying layers act to cause any current flowing between the contacts to flow preferentially through the mesa and therefore through the active layer. In one form, the burying layers may present non-conducting semiconductor junctions to current flow between the contacts in use of the device. Good electrical confinement is provided if the semiconductor layers between the contacts constitute a p-n junction and the burying layers in combination with the substrate constitute a n-p-n junction when taken in the same direction. In use the burying layers and substrate then comprise a reverse biased semiconductor junction in both directions. Alternatively the burying layers and substrate could present multiple reverse biased semiconductor junctions in one or both directions.

In another form, the burying layers may comprise "semi-insulating" materials such as Fe doped InP. These materials have a relatively high resistivity compared to for instance undoped InP. Burying layers in this form have advantages in that they substantially completely oppose current flow and show low capacitance effects. Low capacitance effects tend to increase device speed.

In the past devices of this type have been fabricated by means of liquid phase epitaxy (LPE). However there are problems associated with these techniques such as solutal convection within the melts, inaccurate thickness control of the burying layers and meltback of the mesas during fabrication. These have led in particular to lack of uniformity over large areas and the techniques do not lend themselves easily to large scale production.

In the disclosure by O Mikami et al, a method for manufacturing a device with resistive burying layers is described. The layers which will constitute the mesa, comprising InP and quaternary layers, are grown on a semiconductor wafer by LPE, the mesa being produced by chemical etching on either side of a $Si_3N_4$ masking stripe. The burying layers, of high-resistivity InP, are then grown by vapour phase epitaxy (VPE) to either side of the mesa. The $Si_3N_4$ stripe remains during the VPE growth stage, preventing growth on the upper surface of the mesa itself, and is only subsequently removed.

The characteristics of two lasers produced by O Mikami et al are claimed to be as follows:

1 (i) active layer thickness 0.2 $\mu$m
　(ii) active layer width 4 $\mu$m
　(iii) pulsed threshold current about 85 mA
2 (i) active layer thickness 0.2 $\mu$m
　(ii) active layer width 10 $\mu$m
　(iii) pulsed threshold current about 800 mA to 500 mA
　(iv) single longitidunal mode output at wavelength 1.525 $\mu$m The Mikami LPE-VPE hybrid technique solves the problem of meltback of the mesas during fabrication but still suffers from disadvantages. It retains an LPE growth step and therefore still does not lend itself to large scale production, a significant leakage current has been observed in the burying layers and the $Si_3N_4$ stripe shows a tendency to be bridged by the burying layers when the width of the stripe is reduced.

An alternative growth technique, metal organic vapour phase epitaxy (MOVPE), has been found promising for large scale device production. It offers a highly desirable combination of features: atomic scale interface abruptness, precise compositional control, and uniformity of thickness and composition over a large area.

Unfortunately it has not been found possible merely to replace the LPE and VPE growth steps of the Mikami technique with MOVPE growth steps. If this were possible, a structure having the better current confinement of reverse biased junction burying layers would be produced, with a concomitant, higher potential output power. Although MOVPE could be used to grow the layers of the mesa, the successful growth of the burying layers in the Mikami technique depends on the growth characteristics of VPE. The chemical etching step of the Mikami technique produces a mesa of a characteristic cross section. If MOPE is used to try and grow burying layers on such a mesa, instead of laterally extending burying layers, upstanding "ears" of InP have been found to develop, the lateral surfaces of the mesa not being continuously covered.

A method of fabricating buried mesa structure lasers using only low pressure "metalorganic chemical vapour deposition" (LP-MOCVD) epitaxial growth steps is outlined in the following paper: "Very Low Threshold Buried Ridge Structure Lasers Emitting at 1.3 $\mu$m Grown by Low Pressure Metalorganic Chemical Vapour Deposition" by M Razeghi et al, Applied Physics Letters, 46 (2) (15.1.85) pages 131–133. (MOCVD is an alternative term for MOVPE.) The method comprises the steps of growing onto an InP substrate, an n-doped InP confinement layer, an undoped GaInAsP active layer, and a p-doped InP layer for avoiding the formation of defects near the active layer during etching. Etching using a mask, the active layer is reduced to a mesa. After removing the mask, the mesa is covered by a p-doped InP layer and a p-doped GaInAs cap layer.

All the growth steps of the above method are performed by low pressure MOVPE and hence large scale production should be facilitated. Further it is particularly convenient since only one growth technique must be employed. However, the devices produced either rely on a built-in potential differences between the large area p-n homo-junctions to each side of the active region and the p-n heterojunction through the relatively small area active region active or involve a more complicated fabrication process. Although a lowest measured threshold current of 11 mA using continuous wave operation has been quoted, the values given for measurements relating to 269 devices were variable in the range from 17.9 mA to 50.0 mA inclusive. 44.6% of these devices had a threshold current of more tha 45 mA. Further, an optical power emission of only up to 15 mW is quoted.

It is an object of the present invention to provide an improved semiconductor structure and methods of manufacture thereof.

Hereinafter, structures and devices may be described in terms, such as "uppermost", which imply a specific orientation of the structure or device. The use of such terms is for convenience of description only and should not be taken to limit any structure or device to a specific orientation.

According to a first aspect of the present invention there is provided a semiconductor structure comprising a substrate having a mesa thereon, the uppermost layer of the mesa being provided by InP, and the lateral surfaces of the mesa being substantially non-reentrant, said lateral surfaces being buried by burying layers whose uppermost surfaces extend upwards and away from the uppermost surface of the mesa to form a flared groove.

Semiconductor structures according to embodiments of the present invention have the advantage that they can be fabricated using MOVPE for all growth steps while having InP as the material of the uppermost part of the mesa. InP offers particularly good optical and electrical confinement characteristics.

It is important for growth of the burying layers by MOVPE that the lateral surfaces of the mesa are not substantially re-entrant. In particular it is preferable that the uppermost layer of the mesa should not contribute (III)A planes to the lateral surfaces. There should not be an overhang of any part of either of the lateral surfaces equal to more than 10% of the width of the uppermost surface of the mesa. More preferably any overhang should not be equal to more than 5% of the width of the uppermost surface of the mesa or there should be no overhang, the mesa being vertically sided or even tapered towards its uppermost surface.

According to a second aspect of the present invention there is provided method of making a semiconductor structure, which method comprises the steps of:
 (i) depositing a layer of metal organic vapour phase growth suppressing material on a semiconductor wafer having an InP uppermost layer;
 (ii) selectively etching the growth suppressing material to form a stripe of said material extending in the <110> crystallographic direction of the wafer;
 (iii) creating the mesa under the stripe, the mesa having substantially non-reentrant lateral surfaces;
 (iv) growing burying layers by metal organic vapour phase epitaxy to bury the lateral surfaces of the mesa; and
 (v) removing the stripe of growth suppressing material.

By making an initial semiconductor structure as above; the stripe of growth suppressing material can be produced so as to be self aligned, and centrally placed on the mesa.

The growth suppressing material may for instance comprise silica.

Preferably the stripe of growth suppressing material is substantially equal in width to the width of the uppermost surface of the mesa. This facilitates growth of the burying layers. For instance, the width of the stripe should not be more than 0.4 $\mu$m greater or less than the with of the uppermost surface of the mesa.

In certain cases it can be difficult to achieve a stripe of growth suppressing material. It has been found that a method of enhancing the growth suppressing properties of the surface of certain materials, such as silica, is to subject that surface to a temperature which lies in the range from 600° C. to 700° C. inclusive for a period of at least one minute in the present of PH$_3$. It may be found preferable to increase that period to more than three or even more than five minutes.

There is more than one method of carrying out steps (ii) and (iii) above. A first method comprises:
 (a) forming a mask of resist material on the layer of growth-suppressing material;
 (b) etching the layer of growth-suppressing material, using the resist mask, such that the mask is undercut;
 (c) reflowing the resist material of the mask so that the portions of the mask which are undercut drop into contact with the semiconductor wafer;
 (d) etching the semiconductor wafer using the resist mask to create the mesa; and
 (e) removing the mask of resist material. A second method comprises:
 (f) forming a mask of resist material on the layer of growth-suppressing material;

(g) selectively etching the layer of growth suppressing material by means of the resist mask to form a double layered mask;

(h) etching the semiconductor wafer using the double layered mask to create the mesa; and (i) removing the mask of resist material, wherein step (i) is preceded by oxidation of the uppermost surface of the wafer so as to degrade the integrity of the subsequent interface between said uppermost surface and the layer of metal organic vapour phase growth-suppressing material.

The oxidation may be carried out by flowing an oxidising gas or gas mixture, such as a nitrogen and oxygen mixture, over the uppermost surface of the wafer.

A particularly important application of the present invention is in the production of lasers which will operate in a single transverse mode. These lasers are of major importance in optical communication systems. Such lasers can be produced from semiconductor structures made by the method of the present invention in which the uppermost surface of the mesa is restricted to being not more than 5 $\mu$m wide.

BRIEF DESCRIPTION OF THE DRAWINGS

A single transverse mode semiconductor laser, and methods for making it, according to embodiments of the present invention will now be described, by way of example only, with reference to the accompanying Figures in which.

DETAILED DESCRIPTION OF THE INVENTION

Each of FIGS. 1 to 6 above shows only a portion of the wafer and stages in the production of only a single laser using that portion of wafer.

FIGS. 1 to 6 are not drawn to scale. They represent cross sections in each case but cross hatching is omitted for the purpose of clarity.

Figure 6:
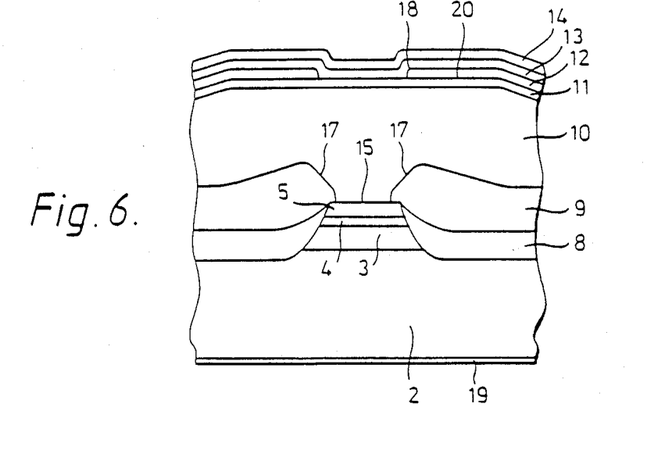
FIG. 6 shows the completed laser.

Referring to FIG. 6, a completed laser comprises a layered mesa 3,4,5 on a substrate 2. The mesa 3,4,5 has sidewalls which taper towards its uppermost surface 15. The sidewalls are buried by burying layers 8, 9 whose uppermost surfaces 17 extend upwards and away from the uppermost surface 15 of the mesa to form a flared groove.

Figure 1:
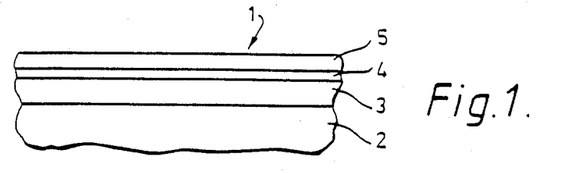
FIG. 1 shows a double heterostructure wafer for use in making the laser.

Referring to FIG. 1, the first stage in production of the laser is to produce a double heterostructure wafer 1. The base layer 2 is a 200 $\mu$m (100) orientated S doped InP layer with the doping level n aproximately equal to $8\times10^{18}$ cm$^{-3}$. Onto the base layer are grown the following three layers 3, 4, 5: a 0.5 $\mu$m S doped InP layer 3, n approximately equal to $2\times10^{18}$ cm$^{-3}$; a 0.14 $\mu$m undoped GaInAsP layer 4; and a 0.3 $\mu$m Cd doped InP layer 5, p approximately equal to $5\times10^{17}$ cm$^{-3}$. The GaInAsP layer 4 has a bandgap equivalent of 1.52 $\mu$m as determined by photoluminescence. The layers 3, 4, 5 are lattice matched, being grown by MOVPE under normal growth conditions.

Figure 2A:
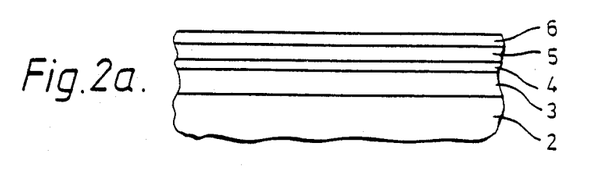
FIGS. 2a to 2f show stages in production of an initial semiconductor structure from the wafer of FIG. 1.

Referring to FIG. 2a, a fifth layer 6 of SiO$_2$ is next deposited. This layer is grown by chemical vapour deposition (CVD), from a mixture of SiH$_4$ and O$_2$ as the active gas, to a thickness of between 100 nm and 300 nm. Growth is carried out at a temperature of 450° C.

Figure 2B:
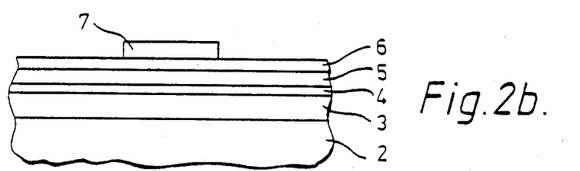

Referring to FIG. 2b, Waycoat W43 negative photoresist material is used to form a mask 7 comprising a stripe 5 $\mu$m wide which extends in the <110> direction with respect to the wafer 1. The mask 7 is exposed and developed in the normal manner then baked at 150° C. for 45 secs to prevent the resist from lifting during the next step.

Figure 2C:
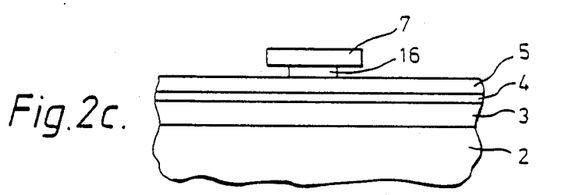

Referring to FIG. 2c, the SiO$_2$ (silica) is etched using the mask 7 by Countdown "silox etch". Etching is isotropic and therefore the photoresist mask 7 is undercut with a 1 : 1 undercut to depth ratio. By periodic observation with a microscope, the extent of silica remaining under the mask 7, which is transparent, can be determined and etching is continued until a stripe 16 of silica 1 $\mu$m wide remains Only the silica is etched by this etchant, the layer below it not being affected. Immediately after etching the sample is stored in a desiccator at 10° C. for at least half a day to remove occluded water from beneath the undercut resist. If this is not done, and water remains, the edges of the resist may not be uniform after the next processing stage.

Figure 2D:
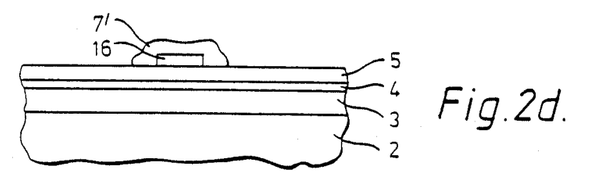

Referring to FIG. 2d, in order to seal the 1 $\mu$m silica stripe 16, the sample is heated at 150° C. for 5 mins. This causes the stripe of the photoresist mask 7 to soften and flow to the extent that the undercut portions drop onto the semiconductor surface, sealing in the SiO$_2$ stripe 16 and restoring the effective mask width to approximately 5 $\mu$m.

Figure 2E:
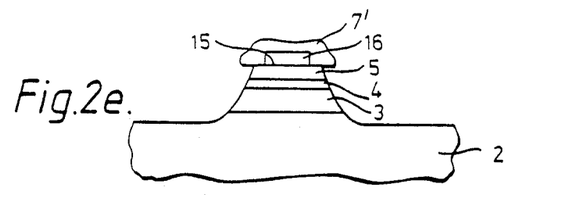

Referring to FIG. 2e, the next stage is to etch a mesa, using the reflowed photoresist as a mask 7'. The quaternary layer of the wafer substrate forms an active layer in the mesa. It can be desirable that the sides of the mesa should be smooth. If this is so, subsequent growth reliability and reproducibility can be enhanced. Further, smooth sides can lead to improved performance in a completed laser. In order to obtain smooth sides of the mesa, an etchant which will etch the different layers 2, 3, 4, 5 of the double heterostructure wafer, including the active layer, at substantially equal rates should be used. In the present method a 0.2% solution of bromine in methanol at 20° C. is used but other etchants could be used, such as a solution of bromine in acetic acid. This produces a mesa having only a relatively slight shoulder at the level of the active layer 4.

Again, the extent to which the photoresist mask 7' is undercut during etching can be monitored using a microscope. Etching is continued until the uppermost surface 15 of the mesa is in the range from 1.2 $\mu$m to 1.5 $\mu$m wide. This dimension range is desirable for correct operation of the completed laser.

The dimensions give for the stripe 16 of SiO$_2$ and the mesa may of course be varied but preferably, for the purpose of reliability, the stripe 16 of SiO$_2$ should be not more than 0.4 μm different in width to the uppermost surface 15 of the mesa.

The use of the resist mask 7' in etching the mesa is thought to produce a tapered mesa because the mask 7' does not adhere strongly to the material of the wafer, in contrast to silica masks. The latter tend to produce mesas with strongly reentrant lateral surfaces. Resist materials other than the photoresist material specified above may also be found satisfactory. However it must be possible to reflow the material of the resist mask 7 so as to seal the silica stripe 16, by heat or otherwise.

Figure 2F:
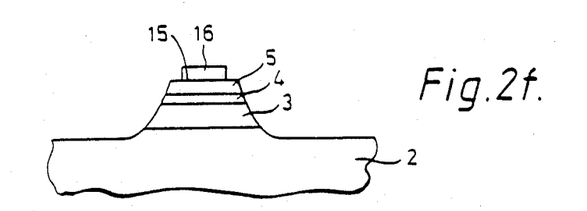

Referring to FIG. 2f, after etching the mesa the photoresist mask 7' is removed. Removal is carried out using Indust-Ri-Chem Lab resist strip J100 and methanol and the silica stripe 16 is left intact. This sample is then cleaned using $H_2SO_4$, rinsed in deionized water and blown dry. The sample at this stage represents the initial semiconductor structure onto which the burying layers are grown and can be described as a substrate having a mesa thereon, a stripe 16 of silica being centrally positioned on the mesa.

Referring to FIGS. 3a to 3f, in an alternative method of making the initial semiconductor structure, again a double heterostructure wafer 1 as shown in FIG. 1 is the starting point. However in this second method the first step is to oxidise the upperost surface of the wafer to degrade a subsequent interface with silica growth-suppressing material.

Figure 3A:
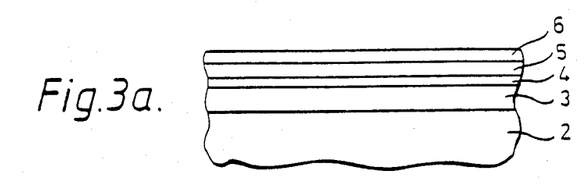
FIGS. 3a to 3f show stages in an alternative method of producing the initial semiconductor structure from the wafer of FIG. 1.

To oxidise the surface, a mixture of nitrogen and oxygen is flowed over the wafer 1 for a few minutes, generally less than ten minutes. A mixture of approximately one part $O_2$ to five parts $N_2$ is appropriate but the flow time and mixture proportions are inter-dependent and the combination must generally be determined by experiment. It may be found for instance that considerably lower proportions of $O_2$ can be effective.

Referring to FIG. 3a, 0.27 μm of silica 6 is then deposited immediately onto the oxidised uppermost surface of the wafer 1 without disturbing the sample.

Figure 3B:
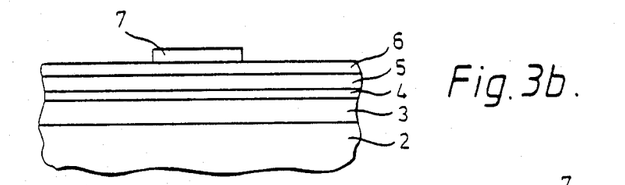

Referring to FIG. 3b, Waycoate negative photoresist material is again used to form a mask 7 comprising a stripe which extends in the <110> direction with respect to the wafer 1. The stripe in this case is less than 5μm wide, being for instance from 4 to 4.5 μm wide where a mesa of depth 1.5 μm is intended. The mask is then baked as before, prior to etching the silica layer 6.

Figure 3C:
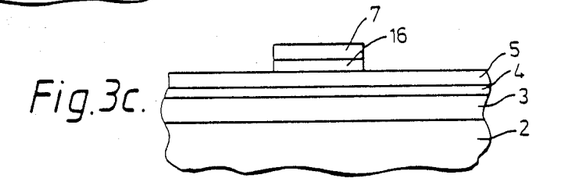

Referring to FIG. 3c, the silica layer 6 is etched using the resist mask 7, to create a double layered mask 16, 7.

Figure 3D:
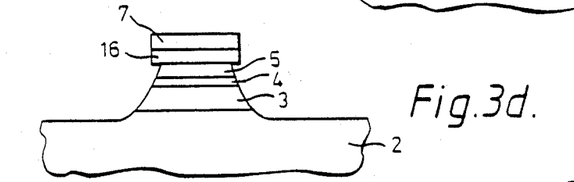

Referring to FIG. 3d, the mesa is then etched using 0.2% Br/MeOH as before. Etching is carried out for a pre-selected time period so as to achieve the required depth. The result is a mesa supporting the double layered mask 16, 7, the mask overhanging the lateral surfaces of the mesa.

Because the overhanging silica can cause difficulty in later stages of the laser fabrication, it is removed. Firstly the sample is rebaked so as to seal the resist mask 7 to the silica stripe 16 but without any significant change in profile of the resist mask 7. Then the sample is placed in buffered HF for a time sufficient to etch away the overhanging silica from beneath where the silica is exposed.

Figure 3E:
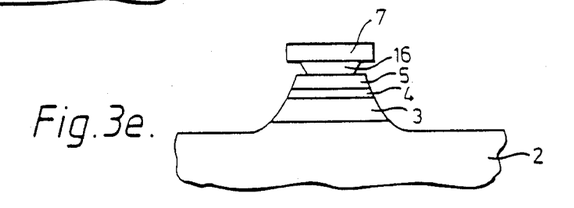

Referring to FIG. 3e, the result of etching the overhanging silica as above is to reduce the silica stripe 16 to a width slightly less than that of the uppermost surface 15 of the mesa. The side surfaces of the stripe 16 slope outwards towards the resist mask 7. This sloping characteristic is a result of the rebaking step which seals the resist mask 7 to the silica stripe 16, and is advantageous when burying layers are subsequently grown.

Figure 3F:
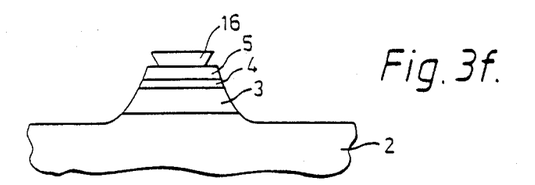

Referring to FIG. 3f, after etching of the overhanging silica, the resist mask 7 is again removed using Indust-Ri-Chem lab resist stripe J100 and methanol. This leaves a mesa with a stripe 16 of silica on top, the uppermost surface 15 of the mesa being exposed over a narow distance at each edge.

Under different conditions, such as where a relatively shallow mesa is etched, the silica stripe 16 may not overhang the mesa to any great extent and may not require the etching step above to remove overhanging material. It has been found that adequately grown burying layers 8, 9 can be achieved even when the silica stripe 16 overhangs the mesa edges slightly. That is, the silica stripe 16 does not cause voids to develop adjacent the mesa as the burying layers 8, 9 are grown. In practice it is preferable that the width of the silica stripe 16 should be not more than 0.4 μm wider or narrower than the width of the uppermost surface 15 of the mesa.

Although both methods described above for making an initial semiconductor structure, with reference to FIGS. 2a to 2f and 3a to 3f respectively, result in a tapered mesa, it is only necessary that the mesa should have substasntially non re-entrant sidewalls. For instance there should not be an overhang of any part of either of the lateral surfaces equal to more than 10% of the width of the uppermost surface 15 of the mesa. Preferably any overhang should not be equal to move than 5% of the width of the uppermost surface 15 of the mesa. If the sidewalls of the mesa overhang to too great an extent then satisfactory burying layers cannot be grown subsequently by MOVPE.

Figure 4:
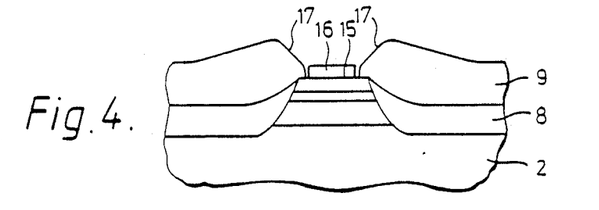
FIG. 4 shows a semiconductor structure which comprises the initial semiconductor structure after burying layers have been grown.

Referring to FIG. 4, the burying layers 8, 9 are grown in two stages onto the initial semiconductor structure : a 0.4 μm Cd doped InP layer 8, p approximately equal to $5 \times 10^{17}$ cm$^{-3}$; and a 0.8 μm S doped InP layer 9, n approximately equal to $1 \times 10^{17}$ cm$^{-3}$. Growth conditions again are generally as is normal for MOVPE growth but before growth starts, the sample is heated to 50° C. for 5 mins in the presence of $PH_3$. This treatment acts to enhance the action of the silica as a MOVPE growth-suppressing material even at stripe widths as low as 1 μm or so.

It should be noted that the period for which the sample must be heated in the presence of $PH_3$ will vary according to the conditions applied. For instance, if the concentration of $PH_3$ is increased, the period may be reduced to three minutes or even to only one minute.

The resultant layers 8, 9 as can be seen in FIG. 3, are grown so that the first layer 8 reaches the height of the mesa and the second layer 9 grows onto the exposed portions of the uppermost surface 15 of the mesa, adjacent to the $SiO_2$ stripe 16. Importantly however, because of the presence of the $PH_3$ treated silica stripe 16, the second layer 9 does not cover the mesa, developing an outwardly inclined facet 17 on each side of the stripe 16, thus leaving the stripe 16 exposed at the bottom of a V-shaped groove.

Although it is possible that the silica stripe 16 does not entirely prevent all growth on its surface during formation of the burying layers 8, 9, it should do so to the extent that the second burying layer 9 forms the flared groove, allowing sufficient access to the silica stripe 16 for its subsequent removal.

Figure 5:
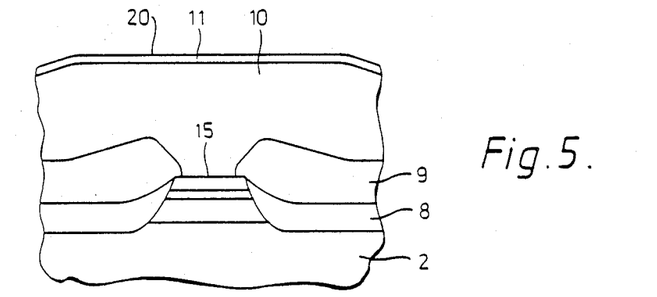
FIG. 5 shows the structure of FIG. 4 overgrown with a covering layer.

Referring to FIG. 5, when the burying layers 8, 9 are complete the silica stripe 16 is removed and two further epitaxial layers, the covering layers 10, 11, are grown.

The silica stripe 16 is removed in a 40% aqueous solution of HF and the two covering layers 10, 11 are grown, as are the earlier epitaxial layers, by MOVPE. Again normal growth conditions for this technique are applied. The covering layers 10, 11 comprise a 1 μm Cd doped InP layer 10, p approximately equal to $2 \times 10^{18}$ cm$^{-3}$, and a 0.15 μm Zn doped GaInAs layer 11, p approximately equal to $4 \times 10^{19}$ cm$^{-3}$.

As can be seen in FIG. 5, the covering layers 10, 11 present a planar uppermost surface 20 in the region which lies over the mesa and the adjoining areas of the burying layers 8, 9. The planar surface 20 has a width which is greater than three times the width of the active layer of the mesa. (It should be noted that the planar surface 20 is not necessarily achieved by the method described above although such a surface can be commonly achieved.)

Referring to FIG. 6, the final laser structure is completed by the conventional steps of providing a contact window 18 over the mesa, in a silica layer 12, and contacts 13, 14, 19 to the window 18 and to the opposing face of the laser. The contact 13, 14 to the window 18 is a sputtered Ti Au tunnelling Schottky contact, which may include a Pt barrier layer, while the contact 19 to the laser's opposing face is a sputtered and alloyed Ti-Au contact.

This final laser structure can be mounted (not shown) on a heat sink by soldering the heat sink to the contact 13, 14 to the window 18. Because of the planar surface 20, the solder need only have a thickness such as to accommodate the steps produced by the contact window 18. Hence the heat sink can be brought into close proximity to the semiconductor material of the mesa.

Figure 7:
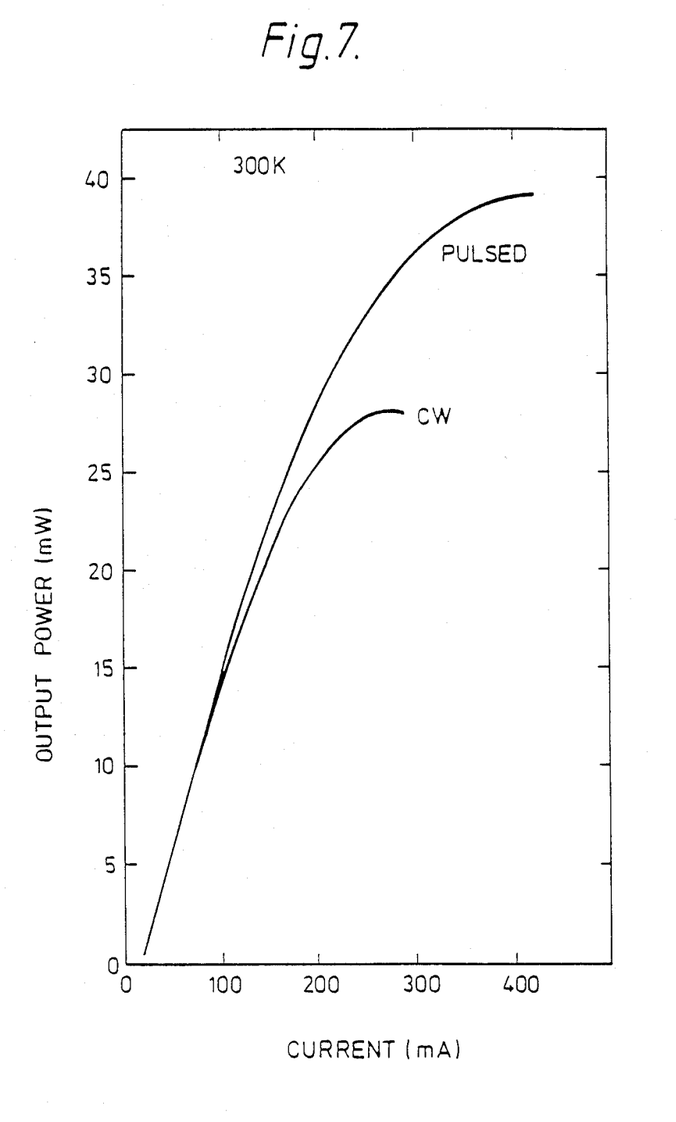
FIG. 7 shows a graph of output power in mW plotted against bias current for a completed laser.

Some typical operating characteristics of a laser fabricated as described above are shown in FIG. 7. A threshold current of 15 mA at 20° C. and an output power of 28 mW have been obtained, using continuous wave operation. In pulsed wave operation, an output power of 39 mW has been obtained.

In further testing of lasers made as described above, measurements of differential resistance have shown a consistent value above threshold of 6 ohms which indicates negligible loss of injected current through the burying layers 8, 9. This provides direct evidence that the positioning and integrity of the p-n junction of the burying layers 8, 9 were good. Temperature dependence of the threshold current was characterised by a To value of 50° K. which is typical of 1.5 μm InGaAsP lasers and the measured external quantum efficiency of the laser was found to be 20%. Near circular far field patterns of 38° perpendicular and 32° parallel to the junction plane were obtained, reflecting the ability of the method of the present invention to provide control of the critical waveguide dimensions.

Figure 8:
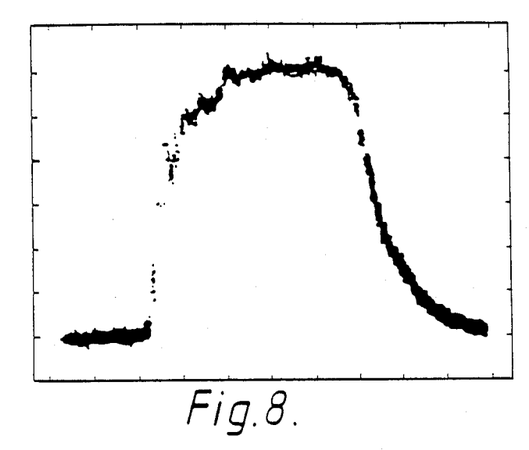
FIG. 8 shows the pulse response of a completed laser to current pulse modulation.

Speed measurements were carried out using a Textronix S6 sampling head. The pulse response, shown in FIG. 8, of a device biased at 20 mA and modulated by a 20 mA current pulse gave values for rise and fall times (10-90%) of 750 psecs and 1 nsec respectively. This indicates a systems capability of at least 565 mbits /sec.

Figure 9:
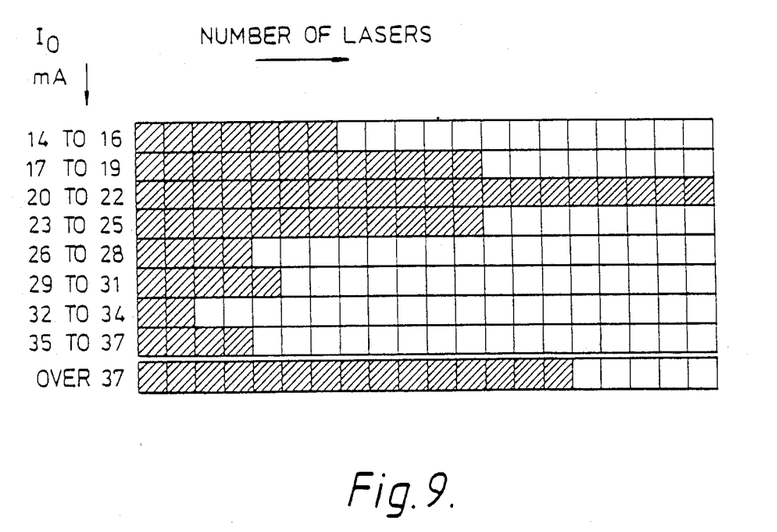
FIG. 9 shows a histogram of threshold currents measured for a plurality of lasers.

Although the method of the present invention is described above with reference to only one laser, in practice a plurality of lasers can be fabricated using a common double heterostructure wafer. In order to investigate the large area capability of the method, 105 lasers were selected randomly from an area of 4 cm$^2$ of a wafer, the mesas of the lasers being parallel and spaced apart with a period of 200 μm. Each laser was obtained by cleaving and scribing, typical device dimensions being 200 μm wide by 400 μm long. 81 of the lasers were found to be functional. A histogram of threshold currents, $I_O$, shown in FIG. 9, was plotted for the 81 working lasers. More than 70% of the working devices, that is, 54% of the total sample of 105 devices had threshold currents of less than 30 mA, providing clear evidence of the large scale uniformity of the method.

Only one laser structure has been described above. Other structures may also be found effective; for instance variation in the thickness of the various layers may be made. In particular, the position of the n-p junction in the burying layers may be brought closer to the p-n junction in the mesa by growing a shallower first burying laer. This may be more difficult to achieve reproducibly in practice but may provide more efficient electrical confinement to the active layer. Further, either fewer or more layers may be provided, such as extra quaternary layers above and below the active layer where a distributed feedback grating is provided. Extra layers may also be used to provide a second n-p junction within the burying layers.

It may be noted that methods according to the present invention are particularly convenient for use in making distributed feedback lasers because corrugations can conveniently be incorporated into the uppermost surface of the mesa.

Devices such as optical detectors or optical waveguides may also be made using methods according to the present invention which is not limited to the production of semiconductor lasers.

We claim:

1. A method of making a semiconductor structure, comprising the steps of:
   (i) depositing a layer (6) of metal organic vapour phase growth suppressing material on a semiconductor wafer (1) having an InP uppermost layer(5);
   (ii) selectively etching the growth suppressing material to form a stripe (16) of said material extending in the <110> crystallographic direction of the wafer (1);
   (iii) creating a mesa under the stripe (16), the mesa having substantially non-reentrant lateral surfaces;
   (iv) growing burying layers (8, 9) by metal organic vapour phase epitaxy to bury the lateral surfaces of the mesa; and
   (v) removing the stripe (16) of growth suppressing material.

2. A method according to claim 1 wherein the growth suppressing material is silica.

3. A method according to either one of claims 1 or 2 wherein the stripe (16) of growth suppressing material is substantially equal in width to the width of the uppermost surface (15) of the mesa.

4. A method according to claim 3 wherein the width of the stripe (16) of growth suppressing material is not more than 0.4 μm greater or less than the width of the uppermost surface (15) of the mesa.

5. A method according to claim 1 wherein step (iv) is preceded by a step which comprises maintaining the initial semiconductor structure at a temperature which lies within the range from 600° C. to 700° C. inclusive for a period of at least one minute in the presence of PH$_3$.

6. A method according to claim 5 wherein the period is at least three minutes.

7. A method according to claim 5 wherein the period is at least five miutes.

8. A method according to claim 1 wherein steps (ii) and (iii) comprise:
   (a) forming a mask (7) of resist material on the layer (6) of growth-suppressing material;
   (b) etching the layer (6) of growth-suppressing material, using the mask (7), such that the mask (7) is undercut;
   (c) reflowing the resist material of the mask (7) so that the portions of the mask which are undercut drop into contact with the semiconductor wafer (1);
   (d) etching the semiconductor wafer (i) substrate using the mask (7') to create the mesa; and
   (e) removing the mask (7') of resist material.

9. A method according to claim 1 wherein steps ii) and iii) comprise:
   (f) forming a mask (7) of resist material on the layer (6) of growth-suppressing material;
   (g) selectively etching the layer (6) of growth-suppressing material by means of the resist mask (7) to form a double layered mask (16,7);
   (h) etching the semiconductor wafer (1) using the double layered mask (16,7) to create the mesa; and
   (i) removing the mask (7) of resist material, wherein step i) is preceded by oxidation of the uppermost surface of the wafer (1) so as to degrade the integrity of the subsequent interface between said uppermost surface and the layer (6) of metal organic vapour phase growth-suppressing material.

10. A method according to claim 9 wherein the oxidation is carried out by flowing an oxidising gas or gas mixture over the uppermost surface of the wafer substrate (1).

11. A method according to claim 10 wherein the oxidising gas or gas mixture comprises a mixture of $N_2$ and $O_2$.

12. A method as in claim 1, 5, 8 or 9 wherein step (iv) of growing burying layers comprises:
   growing an uppermost burying layer on each side of said mesa which extends upwardly and outwardly therefrom so as to form a flared groove having said stripe of growth suppressing amterial at the bottom of the groove.

13. An opto-electronic device made by the method of claim 12.

14. A semiconductor laser made by the method of claim 12.

* * * * *